US005464978A

United States Patent [19]
Kudo et al.

[11] Patent Number: 5,464,978

[45] Date of Patent: Nov. 7, 1995

[54] METHOD AND APPARATUS FOR ELECTRON ENERGY ANALYSIS

[75] Inventors: Masato Kudo; Tetsu Sekine; Koji Murakami, all of Tokyo, Japan

[73] Assignee: JEOL Ltd., Tokyo, Japan

[21] Appl. No.: 296,521

[22] Filed: Aug. 26, 1994

[30] Foreign Application Priority Data

Sep. 23, 1993 [JP] Japan .................................... 6-219989

[51] Int. Cl.[6] ........................................ H01J 37/05

[52] U.S. Cl. ........................................ 250/305

[58] Field of Search .................................... 250/305, 397

[56] References Cited

U.S. PATENT DOCUMENTS

| | | | |
|---|---|---|---|
| 3,914,606 | 10/1975 | Hashimoto et al. | 250/305 |
| 4,593,196 | 6/1986 | Yates | 250/281 |
| 4,758,723 | 7/1988 | Wardell et al. | 250/305 |
| 4,959,544 | 9/1990 | Sukenobu | 250/305 |
| 5,118,941 | 6/1992 | Larson | 250/305 |
| 5,149,966 | 9/1992 | Silari et al. | 250/305 |

*Primary Examiner*—Bruce C. Anderson
*Attorney, Agent, or Firm*—Webb Ziesenheim Bruening Logsdon Orkin & Hanson

[57] ABSTRACT

An electron energy spectrometer having an electron energy analyzer equipped with plural detectors including a reference detector. The energy of electrons impinging on the reference detector is stepped in increments. The value of these increments can be set at will. The spectrometer has improved detection accuracy and improved detection sensitivity. The spectrometer irradiates the surface of a sample with an electron beam. The energy of the electron beam is swept. The intensities of electrons ejected from the sample surface are analyzed. This instrument utilizes the multidetector scheme. Data about the intensities of the electrons is collected. Interpolation calculations are performed at each value of the energy according to the collected data.

4 Claims, 8 Drawing Sheets

METHOD AND APPARATUS FOR ELECTRON ENERGY ANALYSIS

FIELD OF THE INVENTION

The present invention relates to an electron energy spectrometer which analyzes the energies of electrons such as Auger electrons and photoelectrons ejected from the sample surface on which an electron beam, X-rays or the like are irradiated.

BACKGROUND OF THE INVENTION

Electron energy spectrometers, such as Auger electron spectrometers and photoelectron spectrometers, analyze energies in the manner described below. A typical structure of an Auger electron spectrometer is shown in FIG. 8. Electrons ejected from the sample 41 are analyzed by a cylindrical sector and then detected by the single detector 42. An electron energy spectrum is derived using the output from the detector. In the above analyzer with a single detector, electrons which do not agree with an analyzing condition are disregarded so that the analyzer is an efficient system.

It may be contemplated to use a multidetector arrangement in order to enhance the sensitivity. A multidetector spectrometer uses juxtaposed detectors for detecting energy-analyzed electrons. Each time a sweep of the analyzer is made, electrons of different energies are simultaneously counted by the plural detectors. The counted values are summed up for each different energy value. In this way, the amount of information gathered per unit time is increased.

This is described in further detail by referring to FIGS. 9(*a*), 9(*b*) and 9(*c*). A plurality of detectors 51–53 are juxtaposed so as to be regularly spaced from each other. For the sake of simplicity, only three detectors are shown to be arranged. After the first sweep, as shown in FIG. 9(*a*), the detector 51 detects electrons of energy $E_{-2}$ and produces a total count of $I_{-2}(1)$. At the same time, the detector 52 counts electrons of energy $E_{-1}$ and produces a total count of $I_{-1}(1)$. The detector 53 detects electrons of energy $E_0$ and produces a total count of $I_0(1)$. After the second sweep, as shown in FIG. 9(*b*), the detector 51 detects electrons of energy $E_{-1}$ and produces a total count of $I_{-1}(2)$. The detector 52 counts electrons of energy $E_0$ and produces a total count of $I_0(2)$. The detector 53 counts electrons of energy $E_{+1}$ and produces a total count of $I_{+1}(2)$. After the third sweep, as shown in FIG. 9(*c*), the detector 51 counts electrons of energy $E_0$ and produces a total count of $I_0(3)$. The detector 52 counts electrons of Energy $E_{+1}$ and produces a total count of $I_{+1}(3)$. The detector 53 counts electrons of energy $E_{+2}$ and produces a total count of $I_{+2}(3)$. Data about these total counts are stored in a buffer memory or the like.

We see now more specifically the function of the multichannel detection. Paying attention to the detector 53, we see that the detection energy is swept in the same way as in the prior art electron energy spectrometer equipped with only a single detector. The energy detected by the detector 53 is increased such as $E_0$, $E_1$, $E_2$ . . . . Also, in the multichannel detection system, electrons which are discarded in the single channel detection system are detected simultaneously for counting by the other detectors 51 or 52. After repeating these sweeping operations, the total counts $I_0(1)$, $I_0(2)$, $I_0(3)$, . . . , $I_0(i)$ (where i detectors are provided) obtained from the detectors for the electrons of energy $E_0$, for example, are summed up. In this way, the number of electrons counted per unit time can be increased compared with the prior art techniques. That is, the sensitivity can be improved.

However, as can be understood from the principle of the multidetector method, this method cannot be employed unless the following two requirements are met:

(1) The energy resolution $\Delta E$ (the analyzer pass energy, in other words) is kept constant.

(2) The energy increment, $E_{inc}$, in an energy sweep must be an integral multiple of the difference of the energies detected by successive detectors.

In other words, if these two requirements are not satisfied, the values of electron energy detected as $E_0$ by individual detectors during a sweep do not agree exactly with each other in the example shown in FIGS. 9(*a*), 9(*b*) and 9(*c*). Consequently, the data obtained by the summation does not correctly correspond to the energy $E_0$. This problem is discussed further below.

Generally, in an electrostatic hemispherical electron energy analyzer, electrons ejected from a sample are passed through an input lens, so that the electrons are decelerated and focused. Then, the electrons are made to enter the analyzer. In this case, two different modes of operation are used. In one mode, the ratio of the electron pass energy $E_p$ in the analyzer to the energy E of emitted electrons is always kept constant. This sweeping mode is hereinafter referred to as the CRR (constant retarding ratio) mode. In the other mode, the pass energy $E_p$ is always kept constant, irrespective of the emitted energy E. This mode of operation is hereinafter referred to as the CAE (constant analyzing energy) mode. This is, in the CRR mode, the $E_p$ varies in a constant relation to energy E, for example, when the E is 100 eV, the $E_p$ is 10 eV, and when the E is 200 eV, $E_p$ is 20 eV. On the contrary, in the CAE mode, the $E_p$ is always 10 eV, whatever the E is changed.

In Auger electron spectrometry, the CRR mode is often used. Where plural detectors are regularly spaced from each other, if the instrument is operated in the CRR mode as the swept energy is varied, the difference between the detection energies of the successive detectors also varies proportionately. Therefore, even if the energy is stepped in equal increments for the detector acting as a reference detector, the energy is stepped in unequal increments because of the variation of the detection energy difference between the reference and the other detectors. For example, if the energy is stepped in increments of 1 eV, e.g., in the manner as 100 eV, 101 eV, 102 eV, and so on, for the reference detector, it does not step likewise for the nonreference detectors. The detection energies will be, for example, 101.01 eV, 102.03 eV, and so on. In this way, the energy is stepped in unequal increments and by this the detected energies involve fractions. Since the energies detected by the detectors cannot be made coincident with each other as mentioned above, the values counted by the detectors cannot be summed up at the same detection energy. This induces the degradation of accuracy for the finally processed data.

In photoelectron spectrometry, the CAE mode is frequently used. In this case, the pass energy $E_p$ is kept constant as described above. Therefore, the difference of detection energies between one detector and the reference detector remains constant. Thus, if the reference detector is stepped in equal energy increments, then the other detectors are stepped in equal increments. In consequence, the problems appearing in the CRR mode do not take place. In this case, however, if the energy increment $E_{inc}$ is not an integral multiple of the difference between the energies detected by the successive detectors, then the consistency will be lost when values counted by the detectors are summed up. In this way, a restriction is imposed on the setting of the increment $E_{inc}$.

As seen above, if the multidetector scheme is directly applied to the prior art electron energy analyzer, the two requirements for the normal multidetection cannot be met in the CRR mode, and the same restriction for the selecting energy step will be imposed in the CAE mode. Accordingly, the multidetector schemes have been applied in a very limited condition.

SUMMARY OF THE INVENTION

It is an object of the present invention to provide an electron energy spectrometer free of the foregoing problems.

It is another object of the invention to provide an improved method of implementing electron energy spectrometry.

The above objects are achieved in accordance with the teachings of the invention by an electron energy spectrometer comprising: an electron energy analyzer equipped with a plurality of detector devices including a reference detector device; a sweeping means for sweeping said energy analyzer stepwise so that energy of electrons impinging on said reference detector device is varied from an initial value in equal increments; a means for performing interpolation calculations, using output signals obtained from said detector devices in each step in a sweep, to find intensities of the output signals corresponding to various values of said energy which is varied in equal increments; and a means for summing up intensities of the output signals at each of the energy values for obtaining spectral information, said intensities of the output signals being found by said interpolation calculations.

According to the present invention, even if the stepped energy values for individual detectors are not exactly coincident with each other, data about the electron intensities corresponding to an energy interval for the reference detector can be obtained, because calculation means interpolate data about intensities obtained from the detectors. For instance, in the above example, if data about an electron intensity corresponding to 101.01 eV is actually obtained, the electron intensity corresponding to 101 eV can be derived by interpolation. Therefore, the data can be made coincident with the data obtained from the individual detectors. This enables the increments of the stepped energy to be set at will. Furthermore, even in the CRR mode, the multidetector detection method can be applied accurately. In consequence, the sensitivity of the electron energy spectrometer can be enhanced while maintaining the energy resolution high.

Other objects and features of the invention will appear in the course of the description thereof, which follows.

DETAILED DESCRIPTION OF THE INVENTION

Figure 1:
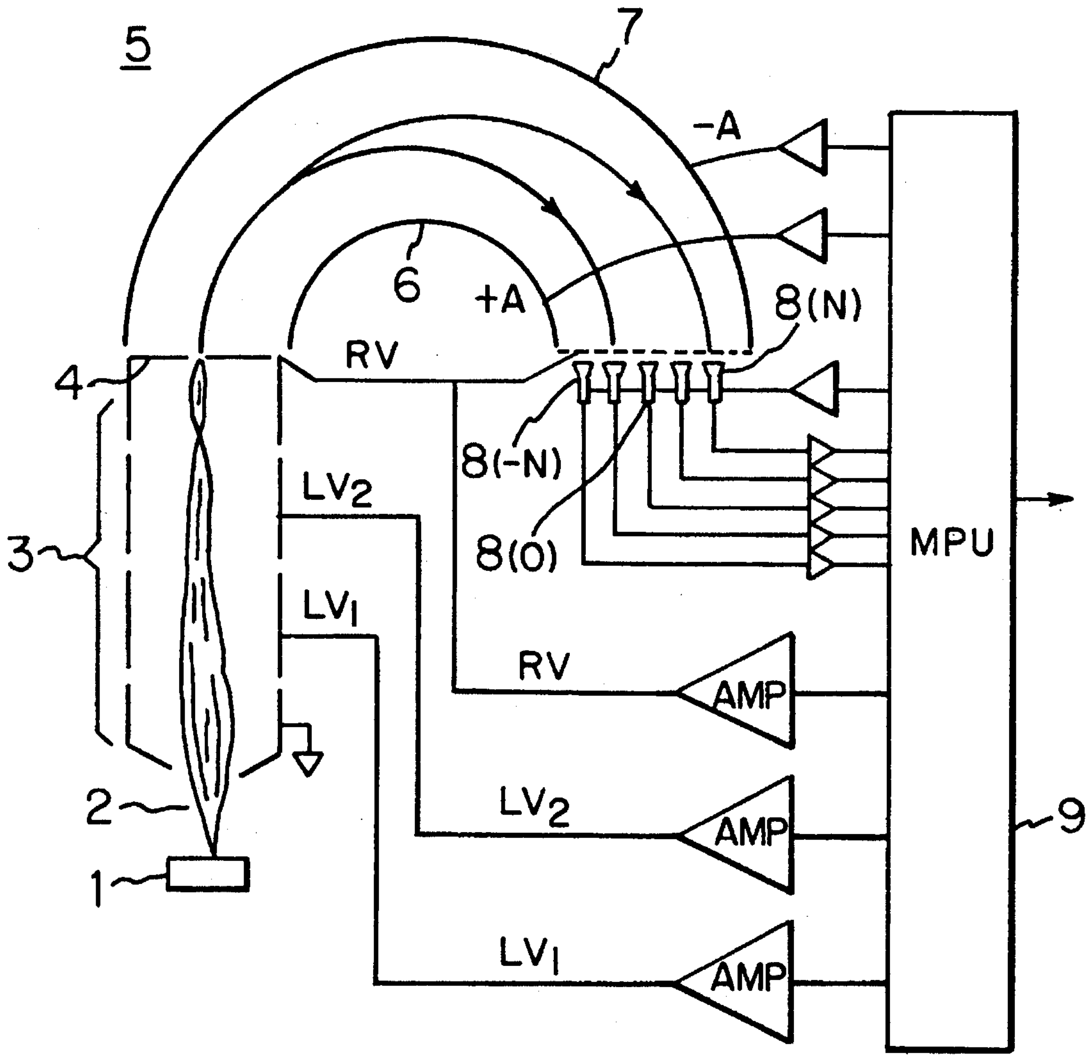
FIG. 1 is a schematic diagram of an electron energy spectrometer according to the invention.
Figure 2:
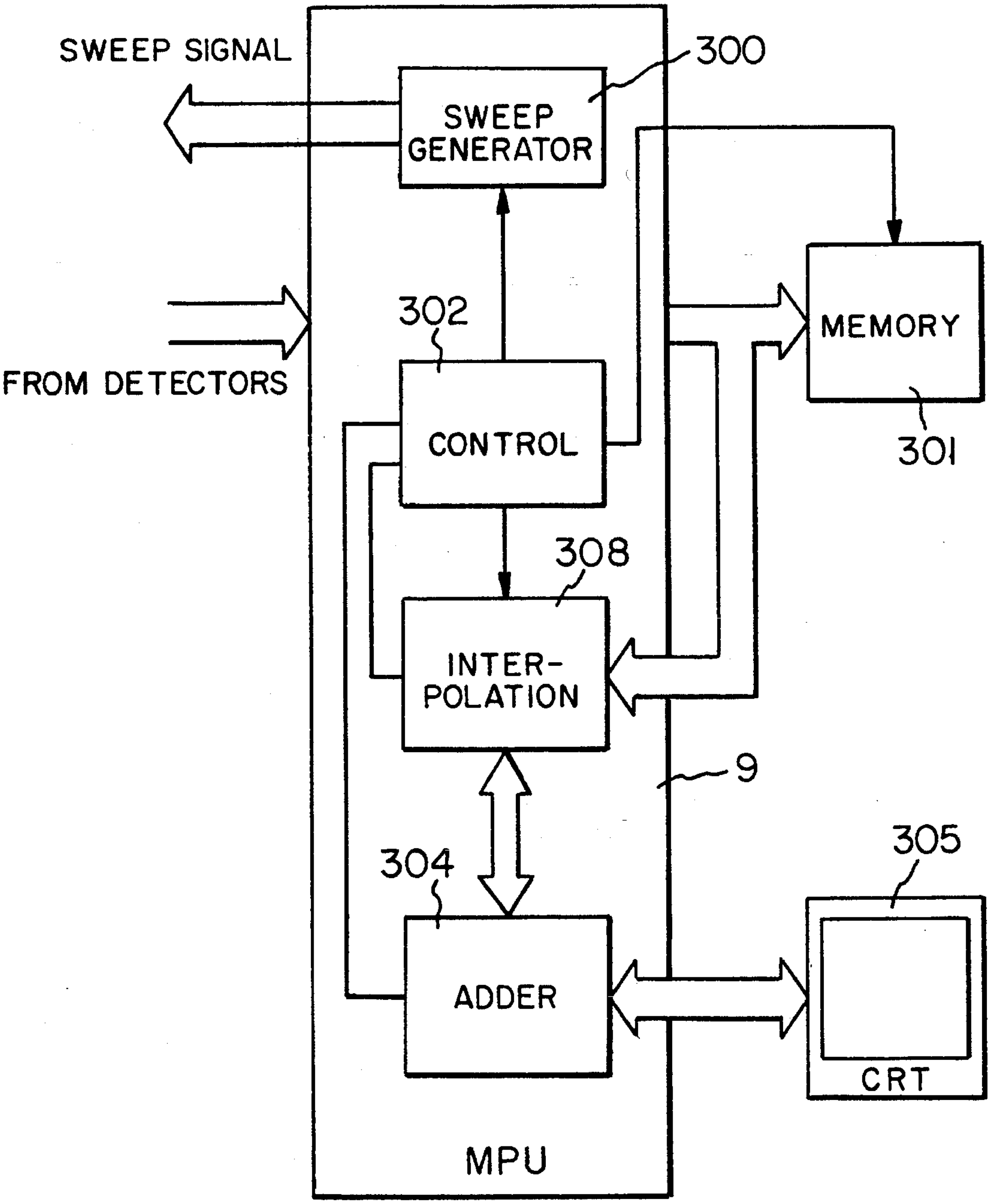
FIG. 2 is a block diagram of main portions of the detection system shown in FIG. 1.

Referring to FIG. 1, there is shown an electron energy spectrometer embodying the concept of the present invention, the spectrometer having a hemispherical electrostatic energy analyzer. FIG. 2 particularly shows the main portions of the multidetection system, including a microprocessor 9. In FIG. 2, the function of the microprocessor 9 is shown in block diagram form.

In FIG. 1, the surface of a sample 1 is irradiated with an electron beam, X-rays, or the like to cause Auger electrons, photelectrons, or other electrons 2 to be ejected from the sample surface. The electrons 2 are decelerated by the work of an input lens 3 and made to focus on the entrance slit 4 of a hemispherical analyzer 5 comprising an inner sphere 6 and an outer sphere 7 which have coaxial (cocentered) spherical surfaces. A plurality of detectors 8 are juxtaposed on the plane where the analyzed electrons focus. Let the number of the detectors 8 be (2N+1), where N is a natural (1, 2, 3, . . . ) number. Number 0 is given to the central detector. Successive numbers up to ±N are given to the other detectors. Positive (+) numbers are assigned to the detectors on the side of the outer sphere. That is, the central, reference detector is indicated by 8(0). The detector closest to the outer sphere 7 is indicated by 8(+N). Similarly, the detector closest to the inner sphere 6 is indicated by 8(–N). The detectors are regularly spaced from each other. Therefore, the +Nth ($1 \leqq n \leqq N$) detector 8(+N) and the –Nth detector (8–N) are symmetrically arranged with respect to the central detector 8(0). Of these detectors, 8(0) indicates the detector which acts as a reference detector when the analyzer 5 is energy swept. The aforementioned microprocessor (MPU) 9 is used to control the electrical potentials at the components 3–8 described above and to process data. The microprocessor 9 includes a sweep signal generator 300 and a control portion 302 as shown in FIG. 2. In response to a control signal from the control portion 302, the sweep signal generator 300 produces a sweep signal for energy-sweeping the analyzer 5 so that the energy of electrons impinging on the reference detector 8(0) is varied from an initial value in given increments. Electrons 2 passed through the entrance slit 4 are made to follow curved trajectories by the action of electrostatic fields applied to the inner sphere 6 and to the outer sphere 7, and then reach the focusing plane, causing energy dispersion. The intensities are measured by the plural detectors 8(–N), 8(–N–1), . . . , 8(0), . . . , 8(N). The output signals from these detectors 8(–N), 8(–N–1), . . . , 8(0), . . . 8(N) are supplied to a memory 301 and stored there under control of the control portion 302. Signals once stored in the memory 301 are read out and supplied to an interpolation calculation portion 303 under control of the control portion 302. The interpolation calculation portion 303 performs interpolation calculations (described later), using the output signals from the detectors 8(–N), 8(–N–1), . . . , 8(0), . . . 8(N), to produce signal intensities corresponding to discrete energy values at which the reference detector 8(0) detects electrons. An adder portion 304 calculates signals to generate a spectrum with a control signal from the control portion 302. That is, the output signal intensities calculated by the interpolation calculation portion 303 contain plural intensities regarding the same energy value. These plural intensities regarding the same energy value are added up to give an intensity at this energy value. This addition operation is performed for every stepped energy. A spectrum can be presented on a CRT 305 according to the output signal from the adder portion 304.

In this configuration, the energy is swept according to the output signal from the sweep signal generator means 300. Suppose the index i (i is 0 or a positive integer) shows the order of energy step, then the energy e(i) of electrons detected by the detector 8(0), which acts as a reference detector, is given by $$e_n(i)=E_{START}+E_{inc}\times i \quad (1)$$

where $E_{START}$ is the initial energy value and $E_{inc}$ is the energy increment in the sweep. Let $E_{STOP}$ be the final energy value, then the maximum step number $i_{MAX}$ is given by $$i_{MAX}=(E_{STOP}-E_{START})/E_{inc}$$

When the energy is being swept as given by Equation (1) above and let $e_n(i)$ be the energy of electrons detected by the nth detector 8(n), then the energy $e_n(i)$ is given, in the CAE (constant analyzing energy) mode, as $$e_n(i)=e_o(i)+n\times k\times E_p \quad (2)$$

and in the CRR (constant retarding ratio) mode, as $$e_n(i)-e_o(i)\times(1+n\times k\times r) \quad (3)$$

where $E_p$ is the pass energy in the analyzer 5 for the CAE mode, and the k is a constant determined by the dimensions of the input lens 3 and of the analyzer 5, and the r is a value determined by the deceleration ratio.

As mentioned above, the constant k and the pass energy $E_p$ remain constant in the CAE mode. As can be seen from Equation (2), the difference (i.e., $n\times k\times E_p$) between the energy e(i) detected by the central detector 8(0) and the energy $e_n(i)$ detected by the nth detector 8(n) is kept constant. Also, the difference (i.e., $k\times E_p$) between the energies detected by successive detectors is kept constant. However, we find the possibility that the value of $e_n(i)$ is not coincident with the value of e(i) unless $n\times k\times E_p$ has a certain relationship with $E_{inc}$.

On the other hand, in the CRR mode, the difference between the energy $e_o(i)$ detected by the central detector 8(0) and the energy $e_n(i)$ of the nth detector 8(n) always varies constantly. As an example, let us assume that k=0.02 and r=0.3, and the detection energy $e_o(i)$ for the central detector 8(0) is swept from 1038 eV with a step $E_{inc}$=1 eV. Under this condition, the energies $e_4(i)$ for the fourth (i.e., n=+4) detector 8(+4) (i.e., the fourth detector when counted toward the outer sphere) is calculated as follows:

$e_o$(0)=1038 eV; $e_4$(0)=1062.912 eV
$e_o$(1)=1039 eV; $e_4$(1)=1063.936 eV
$e_o$(2)=1040 eV; $e_4$(2)=1064.960 eV
$e_o$(3)=1041 eV; $e_4$(3)=1065.984 eV
$e_o$(4)=1042 eV; $e_4$(4)=1067.008 eV
$e_o$(5)=1043 eV; $e_4$(5)=1068.032 eV
$e_o$(6)=1044 eV; $e_4$(6)=1069.056 eV
$e_o$(7)=1045 eV; $e_4$(7)–1070.080 eV

As can be seen from the above list, the difference between the value of $e_o(i)$ and the value of $e_4(i)$ always varies in the CRR mode. Although the energy $e_o(i)$ is stepped in equal increments, the energy $e_4(i)$ is stepped in unequal increments. In consequence, we find that the energy $e_n(i)$ has values with fractions and, therefore, does not exactly agree with the value of the energy $e_o(i)$.

We now take notice of the values of $e_4$(3) and $e_4$(4) of the above list, the capable values that can be piled up to the reference between $e_4$(3) and $e_4$(4) are 1066 eV and 1067 eV. This case arises from the fact that n is positive. Conversely, if n is negative, there is the possibility that no values exist between $e_n(i)$ and $e_n(i+1)$.

In summary, the following problems must be solved, irrespective of the sweep mode, where the multidetector system is applied to an electron energy analyzer:

(1) Where n>0, the value of $e_n$(0), i.e., the initial energy for the nth detector, is larger than $E_{START}$. Where n<0, the final energy $e_n(i_{MAX})$ for the nth detector is less than $E_{STOP}$. These relations are shown concretely in the above-described example of calculation. The value $e_4$(0), initially energy for the detector 8(+4) (n=+4), is 1062.912 eV, which is larger than the set value of $E_{START}$(=1038 eV). Consequently, this detector 8(+4) does not cover energies close to $E_{START}$. That is, what can sweep the whole range from $E_{START}$ to $E_{STOP}$ completely is only the central detector. The energy region that can be swept by any other detector is shifted toward larger or smaller energy side. Therefore, if the energy is swept simply, then the sum data which should be obtained from the vicinities of $E_{START}$ and $E_{STOP}$ will be lacked.

(2) The energy $e_n(i)$ does not always agree with any one of the values of $e_o(i)$. Rather, it should be considered that the energy $e_n(i)$ has a fraction and agrees with none of the values of $e_o(i)$.

(3) In the CRR mode, if n>0, the amount of energy step is larger than $E_{inc}$, and if n<0, the amount of energy step is smaller than $E_{inc}$. Therefore, there happens a case that any value of $e_o(i)$ may not exist between $e_n(i')$ and $e_n(i'+1)$, or a case that two or more values of $e_o(i)$ may exist between $e_n(i')$ and $e_n(i'+1)$.

Based on the principle described thus far in the present example, the apparatus is controlled by the microprocessor 9 to sweep the energy and to detect the intensities of electrons in the manner described below.

(1) Regarding the sweep energy controlled by the sweep signal generator means 300, the start energy is set less than $E_{START}$ to permit even the detector 8(+N) closest to the outer sphere to sweep down to vicinities of the $E_{START}$. Also, the stop energy is set larger than $E_{STOP}$ to permit even the detector 8(–N) closest to sweep the energy up to the vicinities of $E_{STOP}$. In the above example, setting 1013 eV as the start energy for the reference detector 8(0), which is less than $E_{START}$ (= 1038 eV), makes possible the detector 8(+4) (n=+4) to detect signals at 1037, 312 eV, which is very close to $E_{START}$ as the start energy.

(2) If data about electron intensities at the energies exactly coincident with $e_o(i)$ is not available, the data corresponding to the desired $e_o(i)$ is found by performing interpolation calculations by means of the interpolation calculation portion 303, using data about the electron intensities corresponding to detected energies close to $e_o(i)$.

(3) In the calculation for the above-described interpolation, if any value of $e_o(i)$ does not exist between detected energies $e_n(i')$ and $e_n(i'+1)$, then no interpolation is performed about this $e_o(i)$.

(4) Also in the above-described interpolation, if two or more values of $e_o(i)$ exist between the detected energies $e_n(i')$ and $e_n(i'+1)$, then an interpolation is performed for each value of the $e_o(i)$, using data about electron intensities corresponding to $e_n(i')$ and $e_n(i'+1)$. In the above example, two energy values, i.e., 1066 eV corresponding to $e_o$(28) and 1067 eV corresponding to $e_o$(29), exist between $e_4$(3) and $e_4$(4). Therefore, data about intensities at these two energies are found from data about the intensities $e_4(3)$ and $e_4(4)$ by interpolation.

The manner in which the apparatus is controlled is now described in detail. The starting point and the ending point of the energy sweep operation described in (1) above are as follows:

(i) In the CAE mode, starting point $E_{START}'$: that value of one of the numerical value sequence ($E_{START}-E_{STEP}\times i$) which is smaller than ($E_{START}-N\times k\times E_p$) and closest to it ending point $E_{STOP}'$: that value of one of the numerical value sequence ($E_{STOP}+E_{inc}\times i$), which is larger than ($E_{STOP}+N\times k\times E_p$) and closest to it $i_{MAX}=(E_{STOP}'-E_{START}')/E_{inc}$ (ii) In the CRR mode, starting point $E_{START}'$: that value of one of the numerical value sequence ($E_{START}-E_{inc}\times i$), which is smaller than ($E_{START}/(1+N\times k\times r)$) and closest to it ending point $E_{STOP}'$: that value of one of the numerical value sequence ($E_{STOP}+E_{inc}\times i$), which is larger than ($E_{STOP}/(1-N\times k\times r)$) and closest to it $$i_{MAX}=(E_{STOP}'-E_{START}')/E_{inc}$$

The spectral energy is swept according to the formula $$E(i)=E_{START}'+E_{inc}\times i \tag{5}$$

where i is an integer which runs from 0 to $i_{MAX}$.

In the Equation (5) above, E(i) is newly used to distinguish it from $e_o(i)$. Let $E_n(i)$ be the energy detected by the nth detector. The energy $E_n(i)$ is given by In the CAE mode, $$E_n(i)=E(i)+n\times k\times E_p \tag{6}$$

In the CRR mode, $$E_n(i)=E(i)+(1+n\times k\times r) \tag{7}$$

The algorithm on calculations performed to obtain data for displaying a spectrum in the CAE mode and the CRR mode is now described. These calculations are performed by the interpolation calculation portion 303 and the adder portion 304. In the present example, for simplicity, every electron intensity is calculated by interpolation not by extrapolation, using two values of $E_n(i)$. However, in some cases, extrapolation may be used. In the description made below, the calculations use a linear interpolation, but a more sophisticated interpolation method can be employed. In the algorithm described below, the following variables are introduced:

$i_n$: a variable assigned to the nth detector. This variable is 0 or a positive integer. At first, this variable is 0. If data about the electron intensities detected by the nth detector contributes to calculations of data about the electron intensities corresponding to the energy value of $e_o(i)$, this variable is increased by one. For example, if the former data contributes to calculations of electron intensities corresponding to $e_o(3)$, then the variable $i_n$ is increased from 3 to 4.

$C_n(i)$: a variable used for checking purposes. Immediately after data about intensities detected by the nth detector contributes to calculations of data about electron intensities corresponding to the energy of $e_o(i)$, the variable assumes a value of 1; before this the variable takes a value of 0. This variable is used to make a decision as to whether data about electron intensities detected by every detector have finished contributing to calculations of data about the electron intensities at $e_o(i)$.

j: a variable that is 0 or a positive integer. At first, this variable assumes a value of 0. Whenever every detector contributes to calculations of data about electron intensities at $e_o(i)$, this variable is increased by one.

$S'_n(i)$: this variable represents data about electron intensities at $E_n(i)$. This is raw data about electron intensities detected by each detector.

$S_n(i)$: this is data about electron intensities corresponding to the energy $e_o(i)$ for the nth detector, the data being calculated from $E_n(i)$ and from the raw data $S'_n(i)$ by interpolation.

S(i): the finally obtained data about electron intensities corresponding to energy value $e_o(i)$. This is derived by summing up the values of the $S_n(i)$ for every value of n (n assumes values from −N to +N).

$T_n$: a constant introduced to make use of the fact that deviation of the energy remains always constant in the CAE mode.

Figure 3:
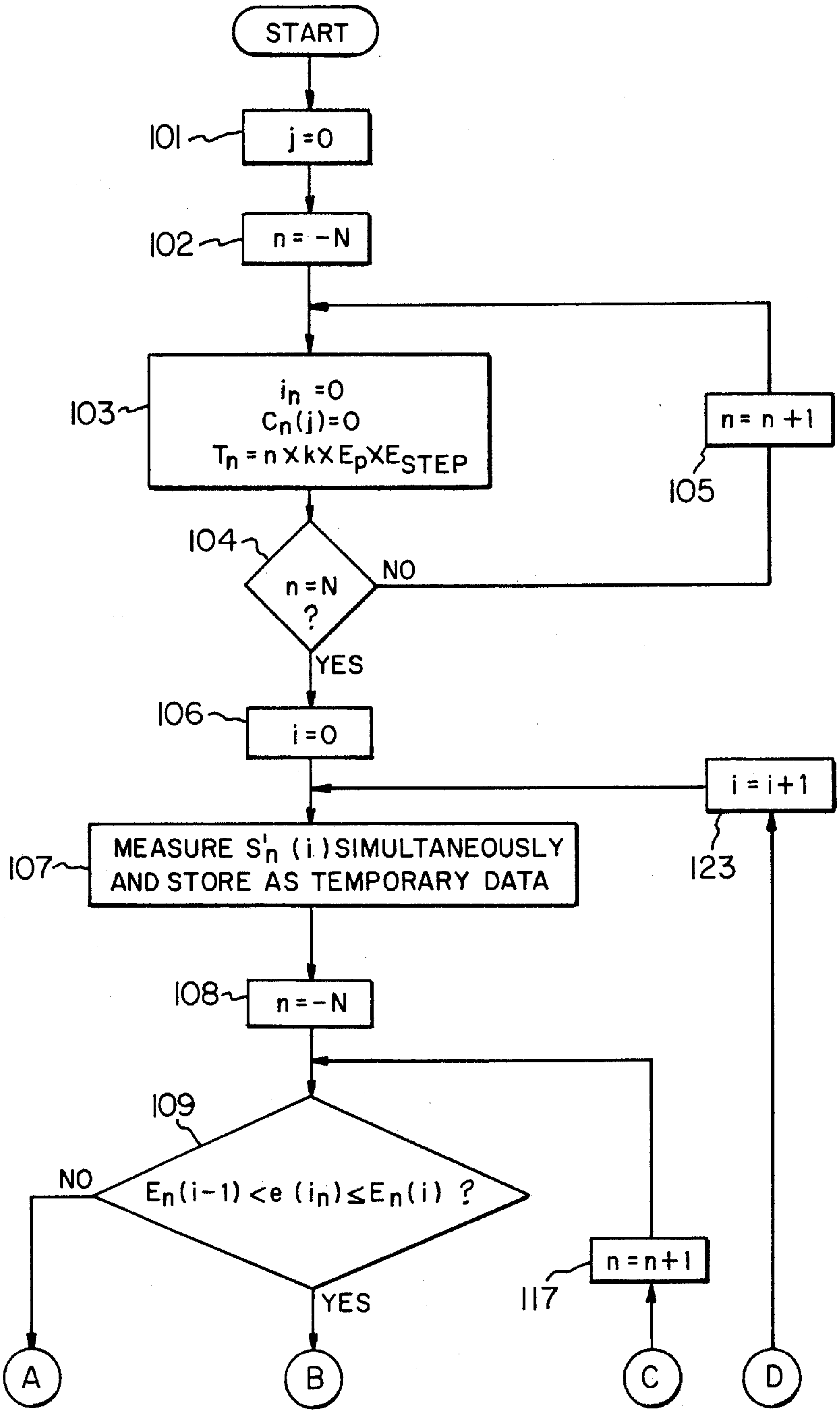
FIGS. 3–5 are flowcharts illustrating fundamental algorithms used when the spectrometer shown in FIG. 1 is operated in the CAE mode.
Figure 4:
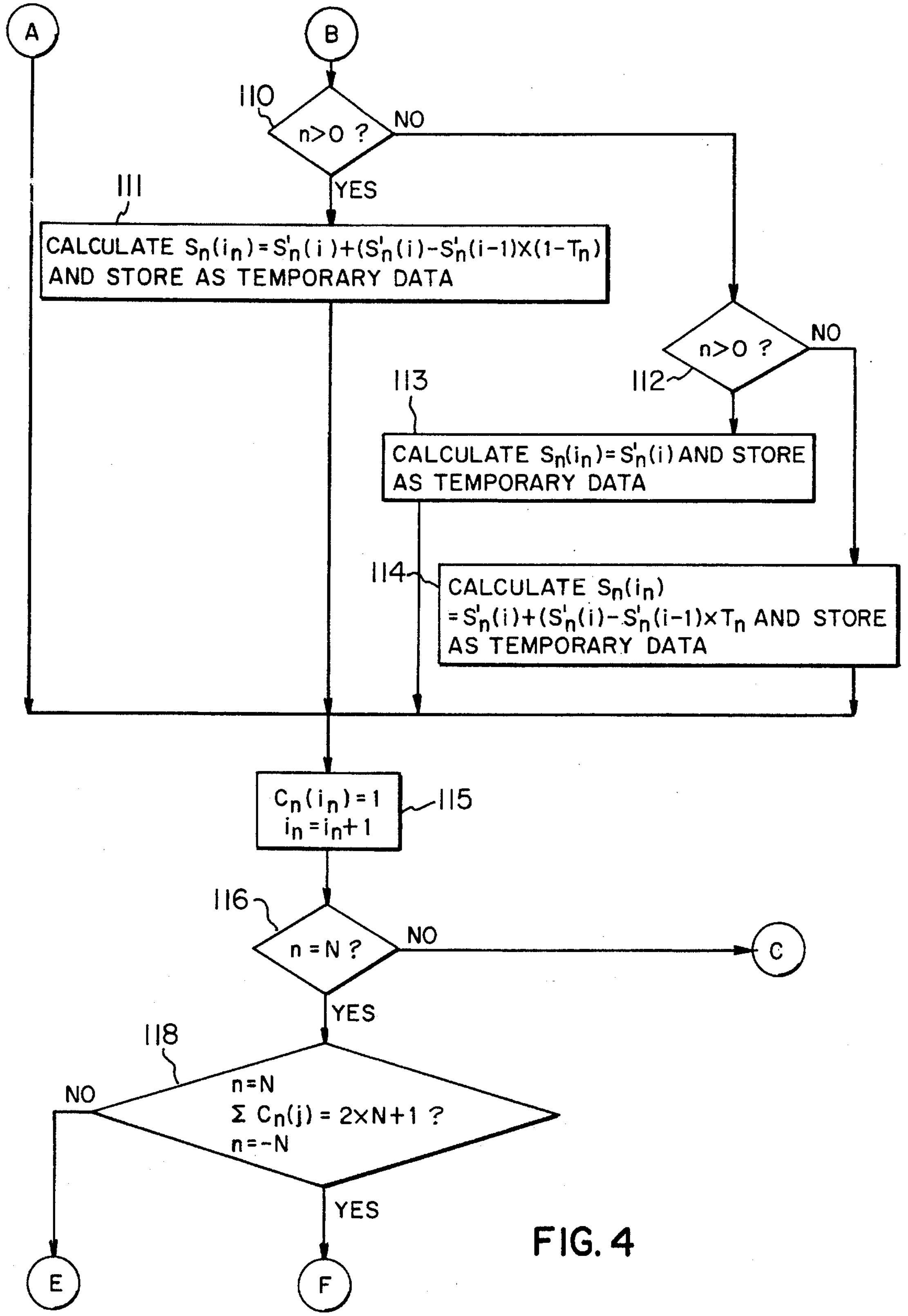
Figure 5:
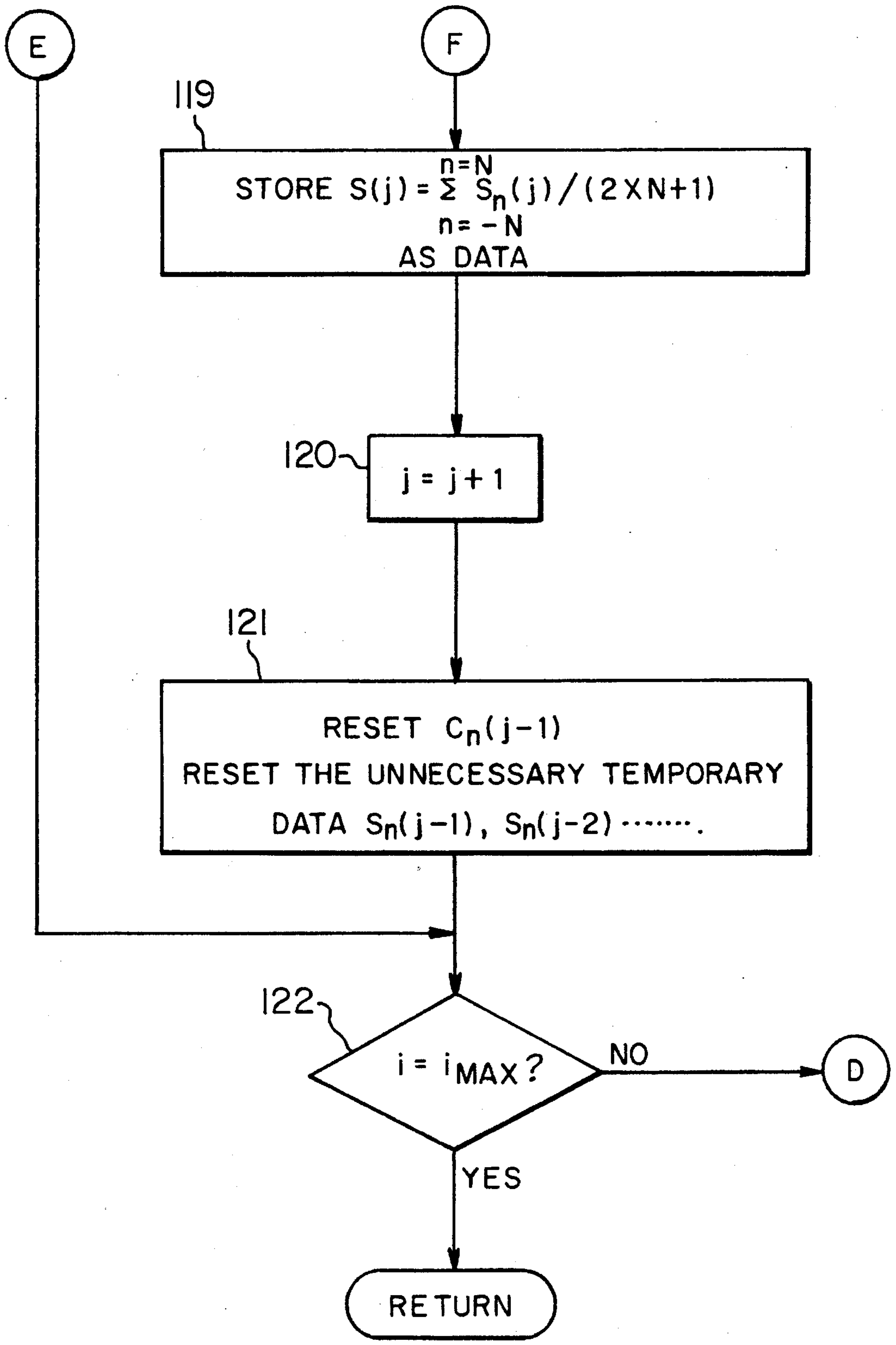

An algorithm for obtaining data for displaying a spectrum when the energy is swept in the CAE mode is now described by referring to the flowcharts of FIGS. 3, 4 and 5.

First the control variable j is set to 0 under control of the control portion 302 (step 101). Then, the control variables $i_n$, $C_n(i)$ and the constant $T_n$ are determined for every value of n ($-N\leqq n\leqq +N$) (steps 102–105).

Thereafter, steps 106–123 are carried out to detect data about electron intensities (raw data) to perform interpolation calculations by means of the interpolation calculation portion 303 and to collect final data for displaying a spectrum by means of the adder portion 304. In step 107, the nth (i is 0 or a positive integer whose maximum value is $i_{MAX}$) step is conducted to collect raw data $S'_n(i)$ from all the detectors at the same time. These data are taken as temporary data and stored in the memory 301.

Then, steps 108–117 are performed to cause the interpolation calculation portion 303 to perform interpolation calculations, using the temporary data $S'_n(i)$. In step 109 a judgment is made as to whether $e_o(i)$ is present between $E_n(i-1)$ and $E_n(i)$ corresponding the temporary data. If $e_o(i)$ exits between them, i.e. , YES, then a judgment is made as to whether n is positive or not (step 110). If n is not positive, then a judgment is made as to whether n is negative or equal to zero (step 112). In response to the results of the judgment, an interpolation calculation is performed in step 111, 113 or 114.

If n is positive, step 111 is carried out. That is, an interpolation calculation is performed according to the following formula:

$$S_n(i_n)=S'_n(i)+(S'_n(i)-S'_n(i-1))\times(1-T_n) \tag{8}$$

If n=0, it follows that this is data obtained from the central detector. Therefore, no interpolation calculation is needed. Control then goes to step 113, where the following relation is established:

$$S_n(i_n)=S'_n(i) \tag{9}$$

If n is negative, step 114 is carried out. That is, an interpolation calculation is effected according to the following formula:

$$S_n(i_n)=S'_n(i)+(S'_n(i)-S'_n(i-1))\times T_n \tag{10}$$

The values of $S_n(i_n)$ found by these interpolation calculations are stored as new temporary data in the memory.

If the result of the judgment made in step 109 is that $e_o(i)$ does not exist between $E_n(i-1)$ and $E_n(i)$, i.e., NO, then no interpolation calculation is performed. In step 115, the control variable $C_n(i_n)$ is set to 1, and the control variable $i_n$ is increased by 1. The sequence described thus far is repeated for every value of n, i.e., from the minimum value of –N to the maximum value of +N.

In the next step 118, a judgment is made as to whether data collected from every detector has finished contributing to calculations of data about electron intensities. If the result of the judgment is YES, then temporary data $S_n(j)$ temporarily stored in the memory 301 after interpolation calculations in step 111, 113 or 114 is read out and sent to the adder portion 304. This adder portion 304 sums up intensities for every value of n ($-N \leqq n \leqq +N$)(step 119). If necessary, the obtained sum is divided by the number of the detectors ($2\times N+1$) to obtain data per detector. The final data obtained in this way is stored in the memory 301 (step 121). The sequence described thus far is repeated until the $i_{MAX}$th step in the sweep is carried out (step 122). As a result, data $S_n(i)$ about electron intensities can be derived for every value of i lying in a given range ($0 \leqq i \leqq i_{MAX}$).

Figure 6:
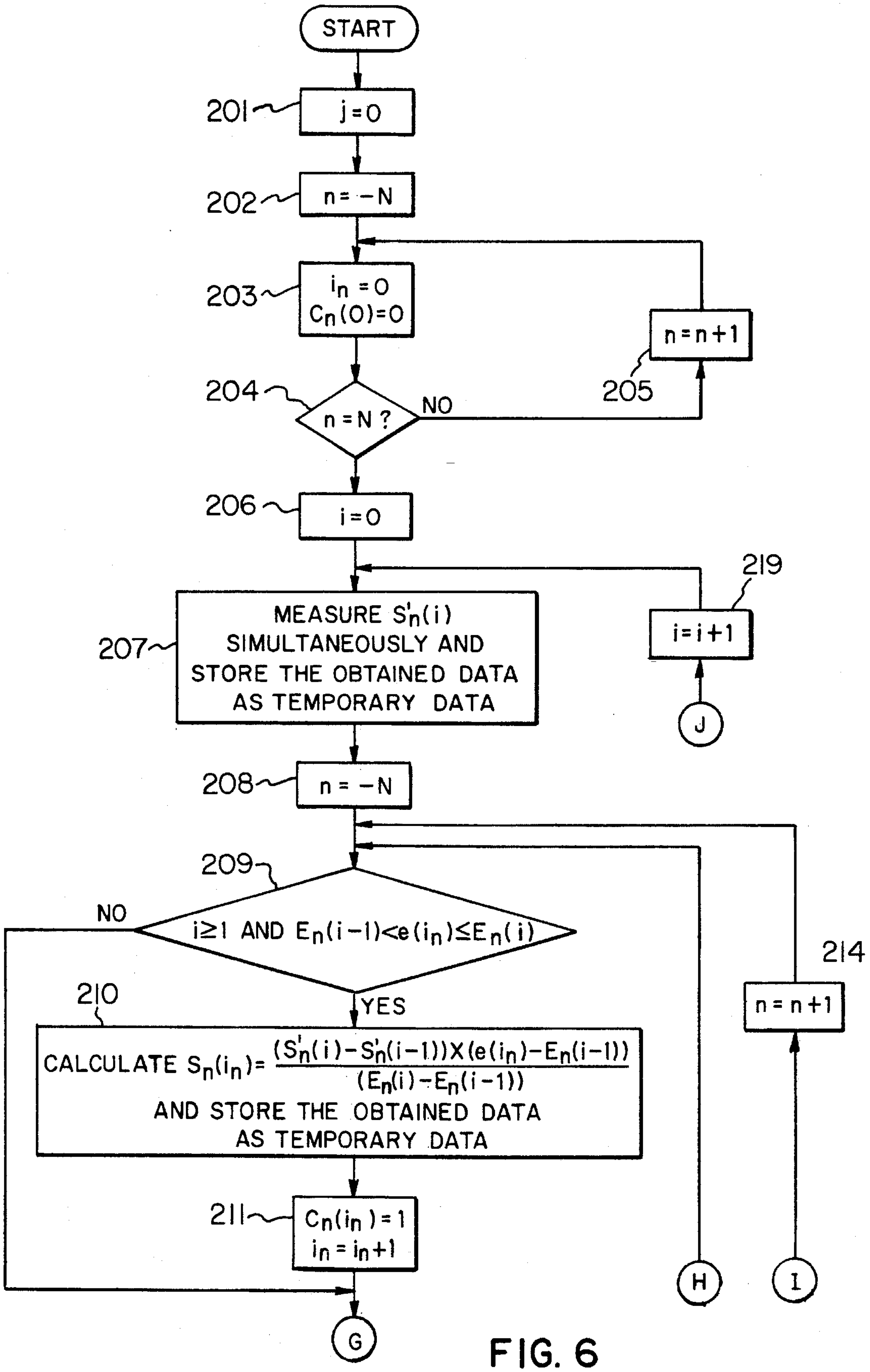
FIGS. 6 and 7 are flowcharts illustrating fundamental algorithms used when the spectrometer shown in FIG. 1 is operated in the CRR mode.
Figure 7:
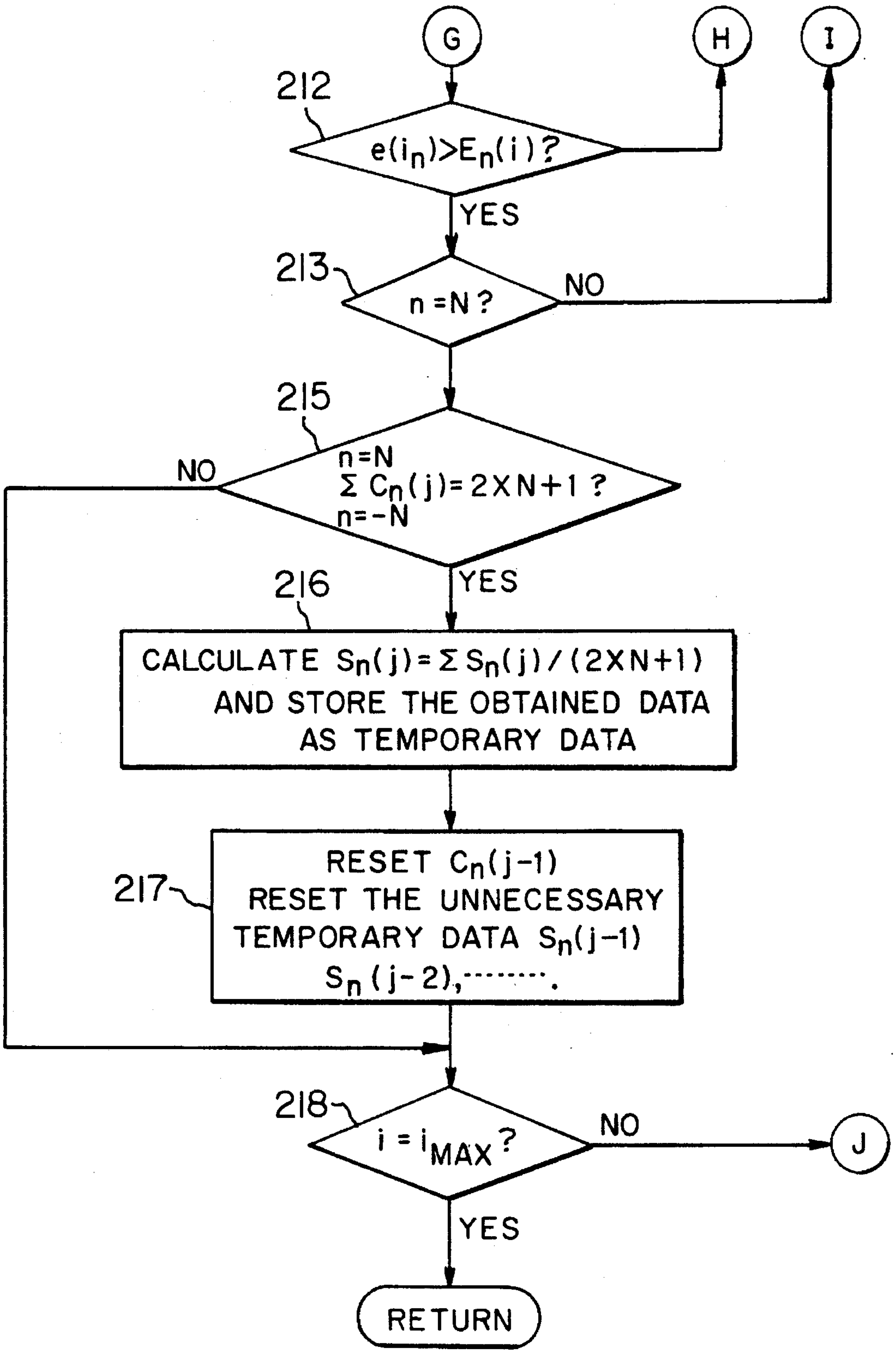
Figure 8:
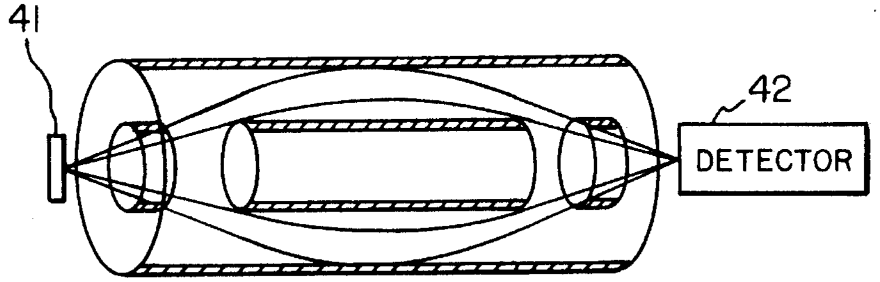
FIG. 8 PRIOR ART
FIG. 8 is a cross-sectional view of the prior art electron energy spectrometer.
Figure 9A:
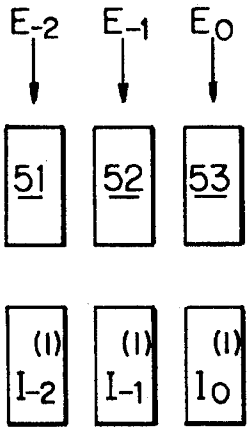
FIGS. 9(*a*), 9(*b*) and 9(*c*) are diagrams illustrating the function of a multidetector spectrometer.
Figure 9B:
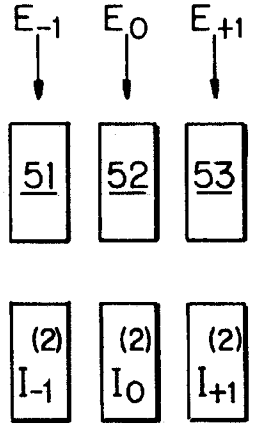
Figure 9C:
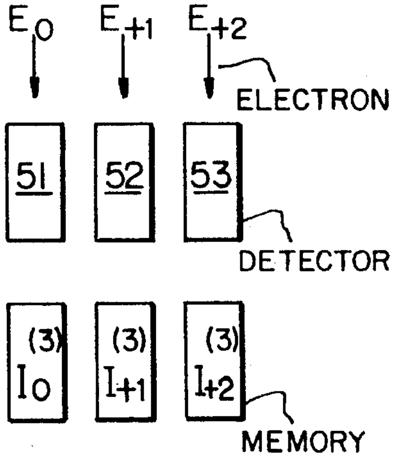

An algorithm for calculations for collecting data when the energy is swept in the CRR mode is now described by referring to the flowcharts of FIGS. 6 and 7. The fundamental theory of this algorithm is the same as the theory of the CAE mode as described in detail thus far. That is, steps 201–205 are carried out for initialization. Steps 206–219 are effected to collect data. Of these steps, step 207 is effected to collect raw data. Steps 208–214 are carried out to perform interpolation calculations. Steps 215–217 are conducted to collect final data.

In the above-described CAE mode, the energy differences between detectors remains constant. An interpolation calculation can be performed, using a relatively simple formula, through the use of the constant $T_n$ as in step 111 or 114 described above. In the CRR mode, the energy difference varies constantly and so it is necessary to perform an interpolation calculation, using the following calculational formula which is usually employed when a linear interpolation is carried out by ordinary interpolation:

$$S_n(i_n)=(S'_n(i)-S'_n(i-1)\times(e_o(i_n)-E_n(i-1))/(E_n(i)-E_n(i-1)) \qquad (11)$$

$S_n(i_n)$ which has been obtained by this interpolation calculation is stored as temporary data in the memory 301. This operation is repeated until the result of the judgment made in step 212 is that $e_o(i_n)>E_n(i)$, Also, steps subsequent to step 209 are carried out for every value of n($-N \leqq n \leqq +N$).

Then, in the same way as in the case of the CAE mode described above, a judgment is made as to whether data from every detector has finished contributing to calculations of data about electron intensities (step 215). If the result of the judgment is YES, then the temporary data $S_n(j)$ temporarily stored after an interpolation calculation in step 210 are summed up for every value of n ($-N \leqq n \leqq +N$) by the adder portion 304. If necessary, the obtained sum is divided by the number of the detectors ($2\times N+1$) to obtain data per detector. This is stored as final data in the memory (step 216).

The sequence described thus far is repeated until the $i_{MAX}$th step in a sweep is carried out (step 218). As a result, data $S_n(i)$ about electron intensities can be derived for every value of i lying in a given range ($0 \leqq i \leqq i_{MAX}$).

As can be understood from the description made thus far, according to the present invention, where the multidetector system is exploited, even if the energies detected by individual detectors are not exactly coincident with each other, data about electron intensities corresponding to a reference energy value in each step in a sweep can be derived, because there is provided a means for performing interpolation calculations for data about electron intensities from the detectors. Therefore, the increments of stepped energy can be set at will. Even in the CRR mode, the multidetector system can be applied adequately. This can enhance the sensitivity of an electron energy analyzer while maintaining the energy resolution high.

Having thus described our invention with the detail and particularity required by the Patent Laws, what is claimed and desired protection by Letters Patent is set forth in the following claims.

What is claimed is:

1. An electron energy spectrometer comprising:

an electron energy analyzer equipped with a plurality of detector devices including a reference detector device;

a sweeping means for energy-sweeping said energy analyzer stepwise so that energy of electrons impinging on said reference detector device is varied from an initial value in equal increments;

a means for performing interpolation calculations, using output signals obtained from said detector devices in each step in a sweep, to find intensities of the output signals corresponding to various values of said energy which is varied in equal increments; and a means for summing up intensities of the output signals at each of the various energy values for obtaining spectral information, said intensities of the output signals being found by said interpolation calculations.

2. The electron energy spectrometer of claim 1, wherein said interpolation calculations are performed, using the output signals from said detector devices which are obtained in different steps in a sweep.

3. The electron energy spectrometer of claim 1 or 2, wherein said different steps in a sweep are successive steps.

4. A method of performing electron energy spectrometry for obtaining a spectral signal, using an electron energy spectrometer equipped with a plurality of detector devices including a reference detector device, said method comprising the steps of:

energy-sweeping said energy analyzer so that energy of electrons impinging on said reference detector device is varied from an initial value in equal increments;

performing interpolation calculations, using output signals obtained from the same detector device in different steps in a sweep to find intensities of output signals from said detector devices at various values of the energy which is varied in equal increments; and summing up intensities of the output signals at each of the various energy values for obtaining spectral information.

* * * * *

UNITED STATES PATENT AND TRADEMARK OFFICE

CERTIFICATE OF CORRECTION

PATENT NO. : 5,464,978

DATED : November 7, 1995

INVENTOR(S) : Masato Kudo, Tetsu Sekine and Koji Murakami

It is certified that error appears in the above-indentified patent and that said Letters Patent is hereby corrected as shown below:

Title page, item [30] Foreign Application Priority Data', "Sep. 23, 1993 [JP] Japan ... 6-219989" should read --Sep. 3, 1993 [JP] Japan ... 5-219989--.

Column 1 Line 50 "Energy" should read --energy--.

Column 5 Line 27 "$e_n(i)-e_o(i)$" should read --$e_n(i)=e_o(i)$--.

Column 5 Line 61 "$e_4(7)$-1070.080 eV" should read --$e_4(7)$=1070.080 eV--.

Column 6 Line 48 "1037, 312 eV," should read --1037.312 eV,--.

Column 9 Line 6 "$S_n(_j)$" should read --$S_n(j)$--.

Column 9 Line 43 "$E_n(i)$, Also" should read --$E_n(i)$. Also--.

Signed and Sealed this

Thirtieth Day of April, 1996

Attest:

Bruce Lehman

BRUCE LEHMAN

*Attesting Officer* *Commissioner of Patents and Trademarks*